United States Patent
Ando

(10) Patent No.: US 8,090,497 B2
(45) Date of Patent: Jan. 3, 2012

(54) VEHICLE ACCESSORY TOUCH SWITCH

(75) Inventor: Yasuyuki Ando, Aichi-ken (JP)

(73) Assignee: Kojima Press Industry Co., Ltd., Aichi-ken (JP)

( * ) Notice: Subject to any disclaimer, the term of this patent is extended or adjusted under 35 U.S.C. 154(b) by 1175 days.

(21) Appl. No.: 11/839,489

(22) Filed: Aug. 15, 2007

(65) Prior Publication Data

US 2008/0140282 A1   Jun. 12, 2008

(30) Foreign Application Priority Data

Dec. 6, 2006 (JP) ................................ 2006-329094

(51) Int. Cl.
*H03K 17/975* (2006.01)
*B60Q 3/02* (2006.01)

(52) U.S. Cl. ........... 701/36; 324/672; 324/679; 200/600

(58) Field of Classification Search .................... 701/34, 701/36, 49; 200/600; 307/9.1, 10.1; 324/658, 324/661, 662, 663, 671, 672, 678, 679, 684, 324/686; 315/77
See application file for complete search history.

(56) References Cited

U.S. PATENT DOCUMENTS

| | | | |
|---|---|---|---|
| 4,413,252 A | 11/1983 | Tyler et al. | |
| 5,239,152 A | 8/1993 | Caldwell et al. | |
| 5,801,340 A | 9/1998 | Peter | |
| 5,867,111 A | 2/1999 | Caldwell et al. | |
| 5,880,718 A | 3/1999 | Frindle et al. | |
| 6,351,072 B1 * | 2/2002 | Mutoh et al. | 315/77 |
| 6,774,505 B1 | 8/2004 | Wnuk | |
| 7,091,886 B2 | 8/2006 | DePue et al. | |
| 7,315,005 B2 | 1/2008 | Cenedese | |
| 7,518,381 B2 | 4/2009 | Lamborghini et al. | |
| 2003/0006701 A1 | 1/2003 | Hanahara et al. | |
| 2005/0083282 A1 | 4/2005 | Honbo | |
| 2005/0219853 A1 | 10/2005 | Iwai | |

(Continued)

FOREIGN PATENT DOCUMENTS

CA    2295900    7/2000

(Continued)

OTHER PUBLICATIONS

Office Action dated Nov. 11, 2008 for related Japanese patent application No. JP2006329094 including English Translation; 6 pages.

(Continued)

*Primary Examiner* — Khoi Tran
*Assistant Examiner* — Spencer Patton
(74) *Attorney, Agent, or Firm* — Ganz Law, PC

(57) ABSTRACT

A touch switch for controlling accessory equipment of a vehicle avoids a malfunction which is caused due to an environmental change such as a change in a state of air, arrival of unnecessary electromagnetic waves, or the like. Conductor plates 20-1 to 20-3 are disposed in an arrangement isolated from one another on a surface opposite to a sensor surface 16T of a touch plate 16 which is touched by a person's hand. The conductor plates 20-1 to 20-3 are each connected to a capacity measurement/control unit 34. The capacity measurement/control unit 34 determines as a judgment value D the absolute value of a value obtained by subtracting a minimum absolute value among changes ΔC1 to ΔC3 in electrostatic capacity from a maximum absolute value among the changes ΔC1 to ΔC3 in electrostatic capacity. The capacity measurement/control unit 34 controls a switch 28 according to the judgment value D.

9 Claims, 9 Drawing Sheets

U.S. PATENT DOCUMENTS

| | | | |
|---|---|---|---|
| 2006/0033508 A1* | 2/2006 | Lee | 324/678 |
| 2006/0054482 A1 | 3/2006 | Radu | |
| 2006/0077187 A1 | 4/2006 | Shigetaka et al. | |
| 2006/0131159 A1 | 6/2006 | Kaps et al. | |
| 2006/0245200 A1 | 11/2006 | Kuwana et al. | |
| 2006/0250142 A1* | 11/2006 | Abe | 324/663 |
| 2007/0211483 A1 | 9/2007 | Ando et al. | |
| 2010/0110712 A1 | 5/2010 | Ando et al. | |

FOREIGN PATENT DOCUMENTS

| | | |
|---|---|---|
| EP | 1257768 A0 | 11/2002 |
| GB | 2345746 A | 7/2000 |
| JP | 59-173943 | 11/1984 |
| JP | 61243401 | 10/1986 |
| JP | 63-98238 | 6/1988 |
| JP | 01-258325 | 10/1989 |
| JP | HEI 5-90754 | 12/1993 |
| JP | 6162888 | 6/1994 |
| JP | 3021894 | 12/1995 |
| JP | 9048279 | 2/1997 |
| JP | 09-288944 | 4/1997 |
| JP | 11136116 | 5/1999 |
| JP | 2000182784 | 6/2000 |
| JP | 2000-207929 | 7/2000 |
| JP | 2001014951 | 1/2001 |
| JP | 2002-316579 | 10/2002 |
| JP | 2003-523891 T | 8/2003 |
| JP | 2004-103285 | 4/2004 |
| JP | 2005-029164 | 2/2005 |
| JP | 2005050635 | 2/2005 |
| JP | 2005-228563 | 8/2005 |
| JP | 2005-231518 | 9/2005 |
| JP | 2005-324607 | 11/2005 |
| JP | 2006-182284 | 7/2006 |
| JP | 2006-196395 | 7/2006 |
| JP | 2006306305 | 11/2006 |
| JP | 2007055551 | 3/2007 |
| JP | 2007-134293 | 5/2007 |
| JP | 2007-230450 | 9/2007 |
| JP | 2008087566 | 4/2008 |
| WO | WO0163172 A1 | 8/2001 |
| WO | WO 2004059343 A1 * | 7/2004 |

OTHER PUBLICATIONS

Third Party Information Disclosure Statement filed Nov. 12, 2007 in Japanese Patent Office for corresponding Japanese Application No. 2006-56837, English cover sheet included, 6 pages.

Office Action dated Dec. 28, 2010 for related U.S. Appl. No. 11/788,632, filed on Apr. 20, 2007. (11 pages).

Office Action dated Oct. 20, 2009 for related Japanese patent application No. JP2006232207 including English Translation; 4 pages.

Office Action dated Feb. 3, 2009, for related Japanese Application No. 2006-329094 including English translation, 4 pgs. (The office action cites JP2006-196395A and JP6-162888A, which are already of record in this case).

Office Action dated Aug. 19, 2008 for related Japanese patent application No. 2006-056837 including English Translation; 4 pages.

Office Action dated Sep. 16, 2008 for related Japanese patent application No. 2006-232207 including English Translation; 4 pages.

English translation of Japanese Office Action dated Jul. 29, 2008.

Office Action dated Jul. 22, 2011 for U.S. Appl. No. 11/788,632 (7 pages total).

* cited by examiner

VEHICLE ACCESSORY TOUCH SWITCH

PRIORITY INFORMATION

This application claims priority to Japanese Patent Application No. 2006-329094 filed on Dec. 6, 2006, which is incorporated herein by reference in its entirety.

BACKGROUND OF THE INVENTION (a) Field of the Invention

The present invention relates to a touch switch for controlling accessory equipment of a vehicle according to changes in electrostatic capacity caused when touched by a person.

(b) Description of the Prior Art(s)

Generally, an inner-door panel of a vehicle has a door pocket in which items such as a map are kept by an occupant in the vehicle. It is somewhat difficult to take out an item from the door pocket because light does not fully reach into the door pocket interior. Therefore, a door pocket provided with a lamp, which can be turned on/off with a touch switch, is used extensively therein. FIG. 8 shows the structure of a door pocket according to related technology.

The door pocket is comprised of mutually opposed side walls 10A and 10B, a main wall 10C which is connected to the side walls 10A and 10B to form a U-shaped wall, and a bottom plate 10D which makes the bottom of the door pocket. The door pocket is fitted to an interior panel 12 such that an opening on the opposite side of the main wall 10C comes in contact with the door interior panel 12. A lamp 14 is attached to the inside surface of the side wall 10A of the door pocket. A touch plate 16 which configures a vehicle accessory touch switch is fixed to the inside surface of the main wall 10C of the door pocket. When the touch plate 16 is touched by a person's hand to turn on the vehicle accessory touch switch, the lamp 14 is supplied with power and turned on.

By configuring as described above, the lamp 14 can be turned on when the occupant in the vehicle puts their hand into the door pocket to touch the touch plate 16. Thus, the occupant can easily take out an item housed in the door pocket.

FIG. 9 shows a structure of a vehicle accessory touch switch 18 according to a related technology applied to a door pocket. The touch plate 16 is formed of a dielectric material such as a synthetic resin or the like. A conductor plate 20 is joined to one surface of the touch plate 16. The conductor plate 20 is connected to a capacity measurement/control unit 24. The capacity measurement/control unit 24 is connected to a ground conductor 26 having electric potential as reference.

A switch 28 is controlled to be in an ON or OFF state by the capacity measurement/control unit 24. One of the terminals of the switch 28 is connected to a negative terminal of a battery 30. The other terminal of the switch 28 is connected to one of the terminals of the lamp 14. The other terminal of the lamp 14 is connected to the positive terminal of the battery 30.

The capacity measurement/control unit 24 measures electrostatic capacity between the conductor plate 20 and the ground conductor 26, and controls the switch 28 if the measured value has a change which exceeds a prescribed threshold value.

According to the configuration as described above, the electrostatic capacity between the conductor plate 20 and the ground conductor 26 can be varied when a surface on the other side of the touch plate 16 having the conductor plate 20 bonded is touched by a person's hand having electrostatic capacity with respect to the ground conductor 26. Thus, lighting of the lamp 14 can be controlled by touching the touch plate 16 with a hand.

The electrostatic capacity between the conductor plate 20 and the ground conductor 26 varies depending on humidity or the like of air around the vehicle accessory touch switch 18. Therefore, the vehicle accessory touch switch 18 might suffer from a malfunction because the capacity measurement/control unit 24 controls the switch 28 even when the electrostatic capacity is varied due to a change in the state of the surrounding air. Also, a noise voltage is induced in the conductor plate 20 by an unnecessary electromagnetic wave generated by other electrical equipment, and an error occurs in the electrostatic capacity measured by the capacity measurement/control unit 24, possibly causing a malfunction of the vehicle accessory touch switch 18.

The present invention has been achieved in view of the above-noted problems. Specifically, an object of the invention is to provide a touch switch for controlling accessory equipment of a vehicle so that a malfunction which may be caused by factors such as a change in the environment, like as a change of state of the air, arrival of unnecessary electromagnetic waves, or the like, can be avoided.

SUMMARY OF THE INVENTION

The present invention provides a vehicle accessory touch switch, comprising a touch section having conductor plates which are touched by a person, a capacity measurement section which measures changes in electrostatic capacity between the conductor plates and a ground conductor, and a control section which controls accessory equipment mounted on a vehicle according to the measured results of the capacity measurement section, wherein the touch switch controls the accessory equipment as a result of the person touching the touch section, the touch section being provided with the plural conductor plates in an arrangement isolated from one another, the capacity measurement section measuring changes in electrostatic capacity between the individual conductor plates and the ground conductor, and the control section controlling the accessory equipment according to a difference among the individual changes in electrostatic capacity measured by the capacity measurement section.

According to the present invention, a touch switch for a vehicle accessory capable of avoiding a malfunction caused by an environmental change can be realized.

DESCRIPTION OF THE PREFERRED EMBODIMENT(S)

Figure 1:
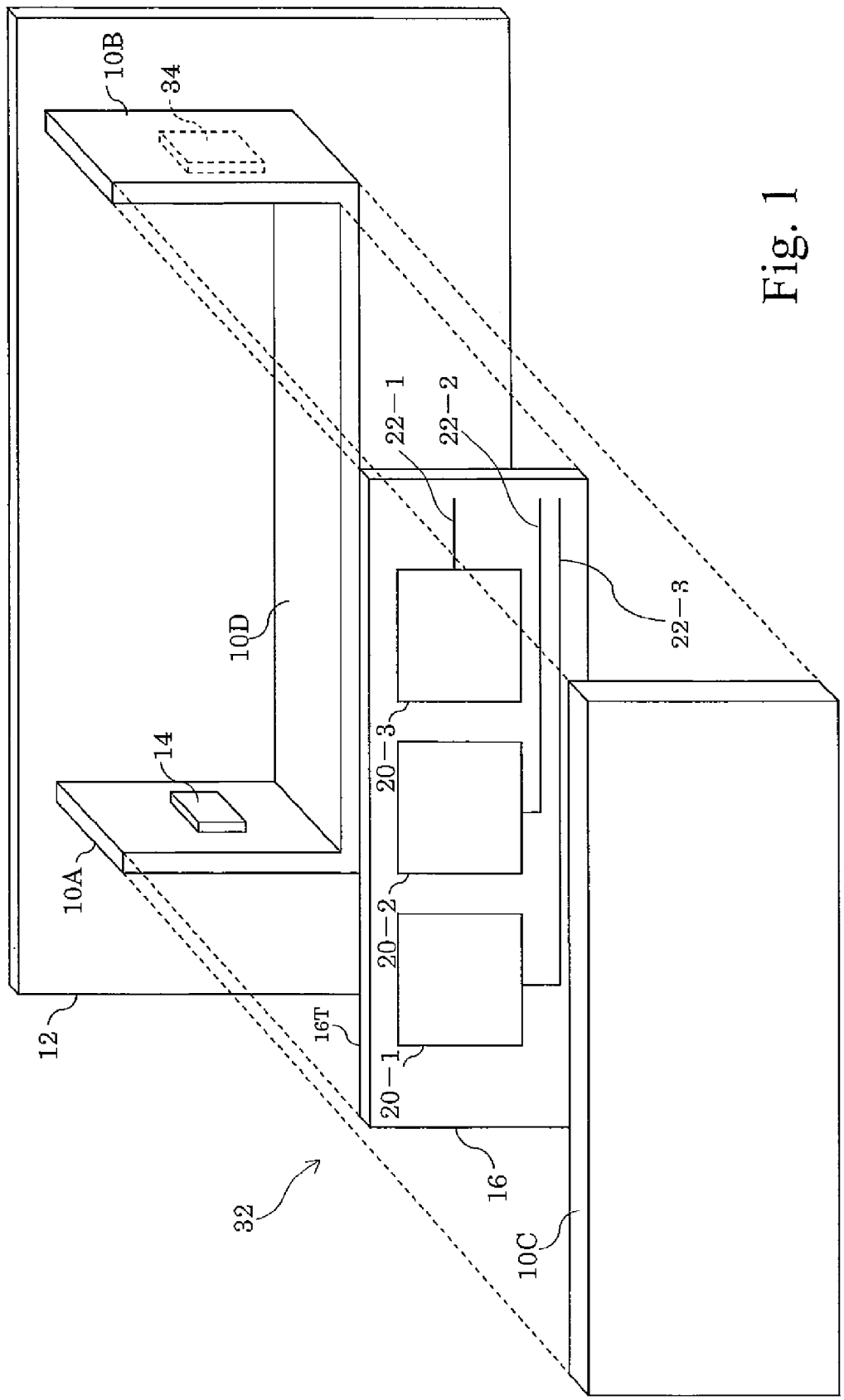
FIG. 1 is an exploded view showing a state where a vehicle accessory touch switch according to a first embodiment is incorporated in a door pocket.
Figure 2:
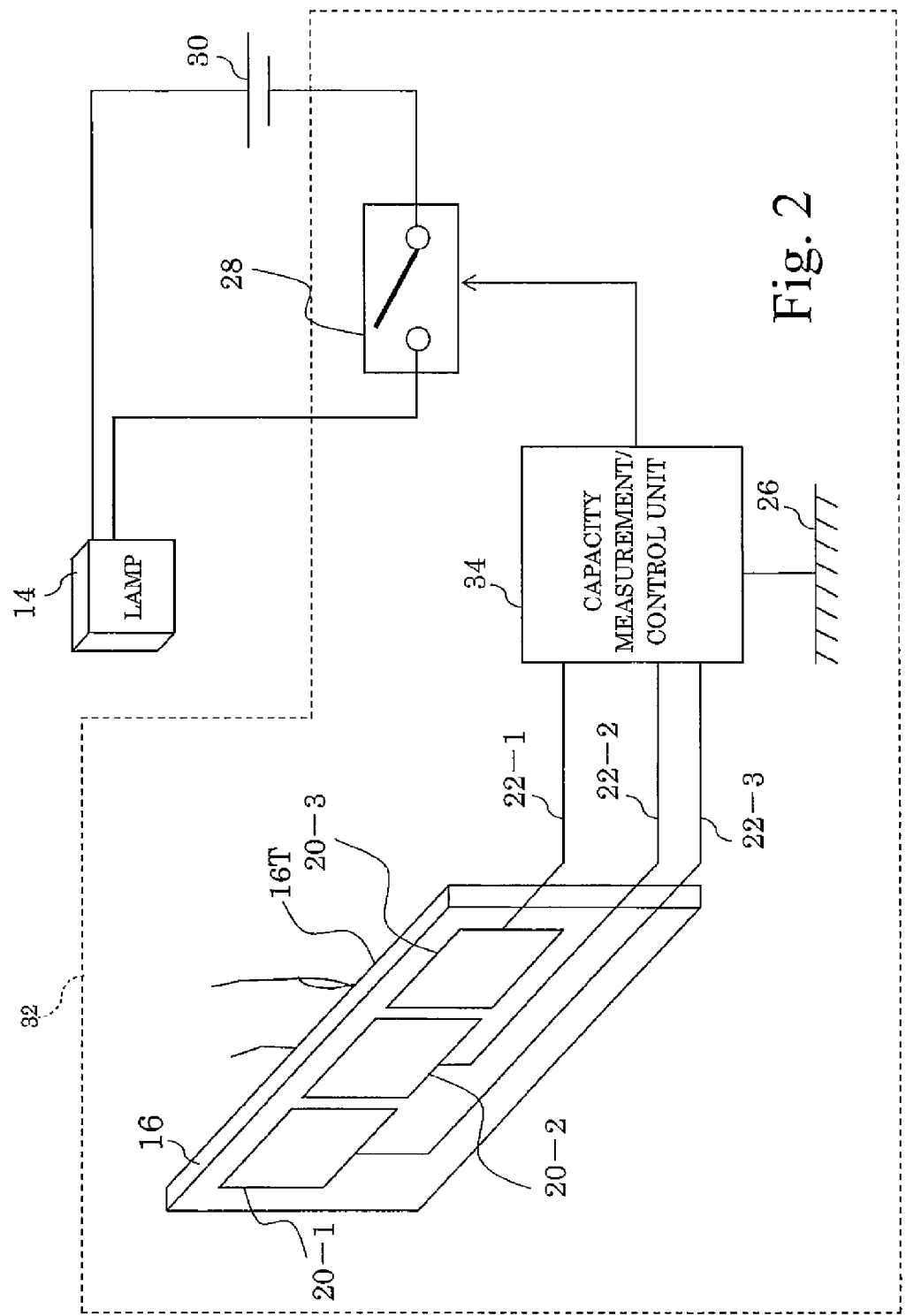
FIG. 2 is a diagram showing a structure of the vehicle accessory touch switch according to the first embodiment.
Figure 8:
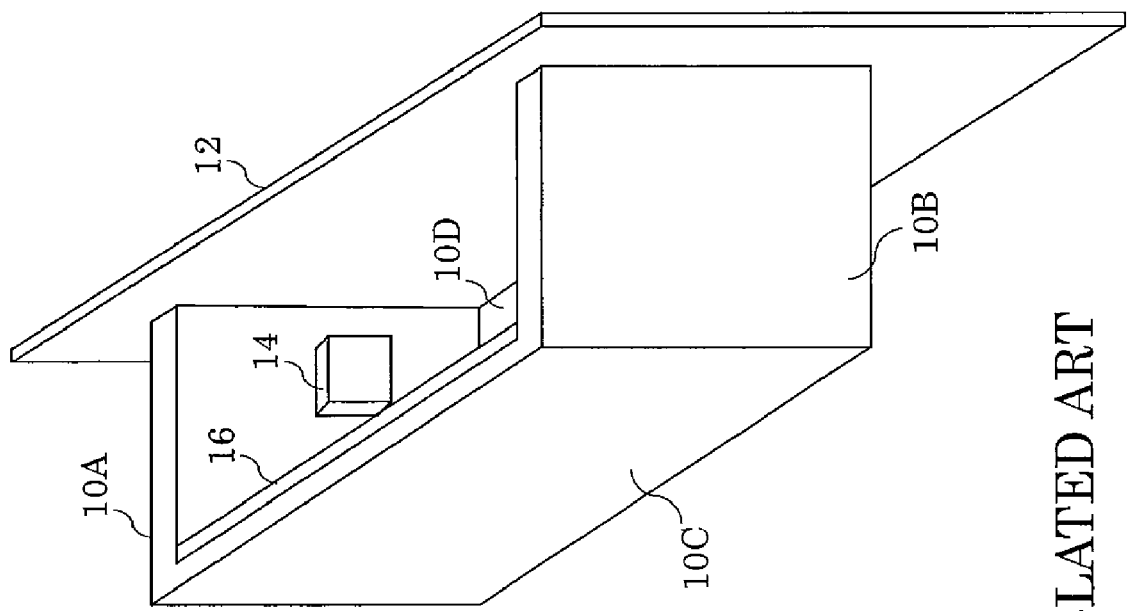
FIG. 8 is a diagram showing a door pocket in which a vehicle accessory touch switch is incorporated.
Figure 9:
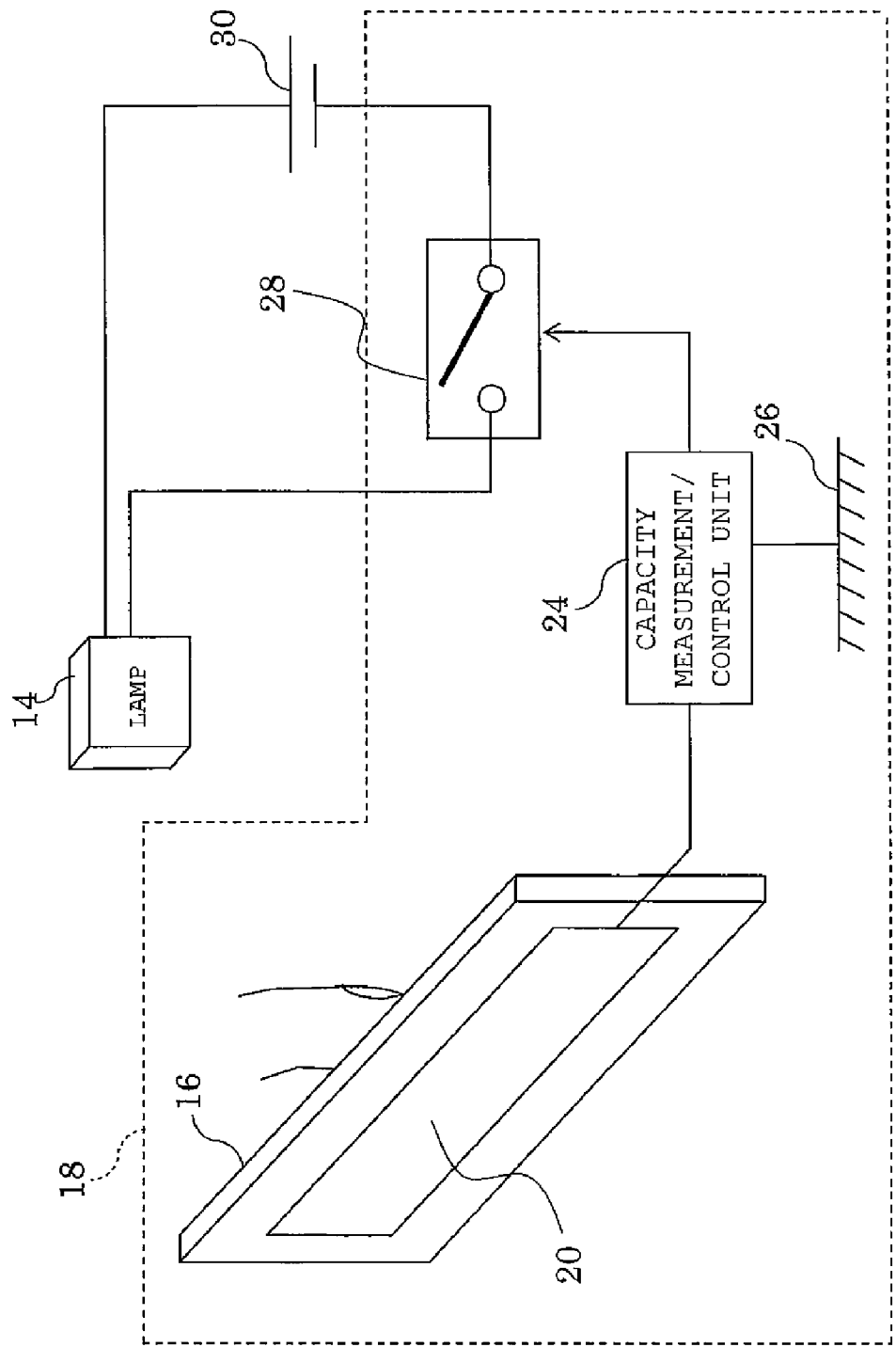
FIG. 9 is a diagram showing a structure of a vehicle accessory touch switch.

FIG. 1 shows an exploded view of a state where a vehicle accessory touch switch 32 according to a first embodiment of the invention is incorporated in a door pocket. FIG. 2 shows a structure of the vehicle accessory touch switch 32. Similar component parts corresponding to those of FIG. 8 and FIG. 9 are denoted by similar reference numerals, and their descriptions will be omitted. The vehicle accessory touch switch 32 has the touch plate 16 provided with three conductor plates 20-1 to 20-3. The conductor plates 20-1 to 20-3 are connected with conductor wires 22-1 to 22-3, and the conductor wires 22-1 to 22-3 are connected to a capacity measurement/control unit 34 which is built into the side wall 10B. The touch plate 16 is fixed to the inside surface of the main wall 10C of the door pocket. The example of FIG. 1 performs controls to turn on the lamp 14 disposed within the door pocket in the same manner as in the example of FIG. 8.

The structure of the vehicle accessory touch switch 32 will be described with reference to FIG. 2. The conductor plates 20-1 to 20-3 are disposed in an arrangement isolated from one another on a surface on the other side of the touch plate 16 having a sensor surface 16T which is touched by a person's hand. The individual conductor plates 20-1 to 20-3 may each have an area larger than an effective touch area of the sensor surface 16T that is touched with the person's hand. The effective touch area means an area of a region effectively contributing to changes in electrostatic capacity between the conductor plates 20-1 to 20-3 and the ground conductor 26 in the area which is actually touched with the person's hand. The conductor plates 20-1 to 20-3 are connected to the capacity measurement/control unit 34.

The capacity measurement/control unit 34 is connected to the ground conductor 26. As the ground conductor 26, the vehicle body is suitably applied.

The switch 28 is controlled by a control signal output by the capacity measurement/control unit 34. For the switch 28, a semiconductor device circuit which is controlled by inputting a pulse signal showing a high electrical potential with respect to an electrical potential of the ground conductor 26 for a prescribed time length is suitably applied.

For the switch 28, a switch which is changed over to an OFF state if it is in an ON state every time a control signal is input, and vice versa, can be applied.

Figure 3:
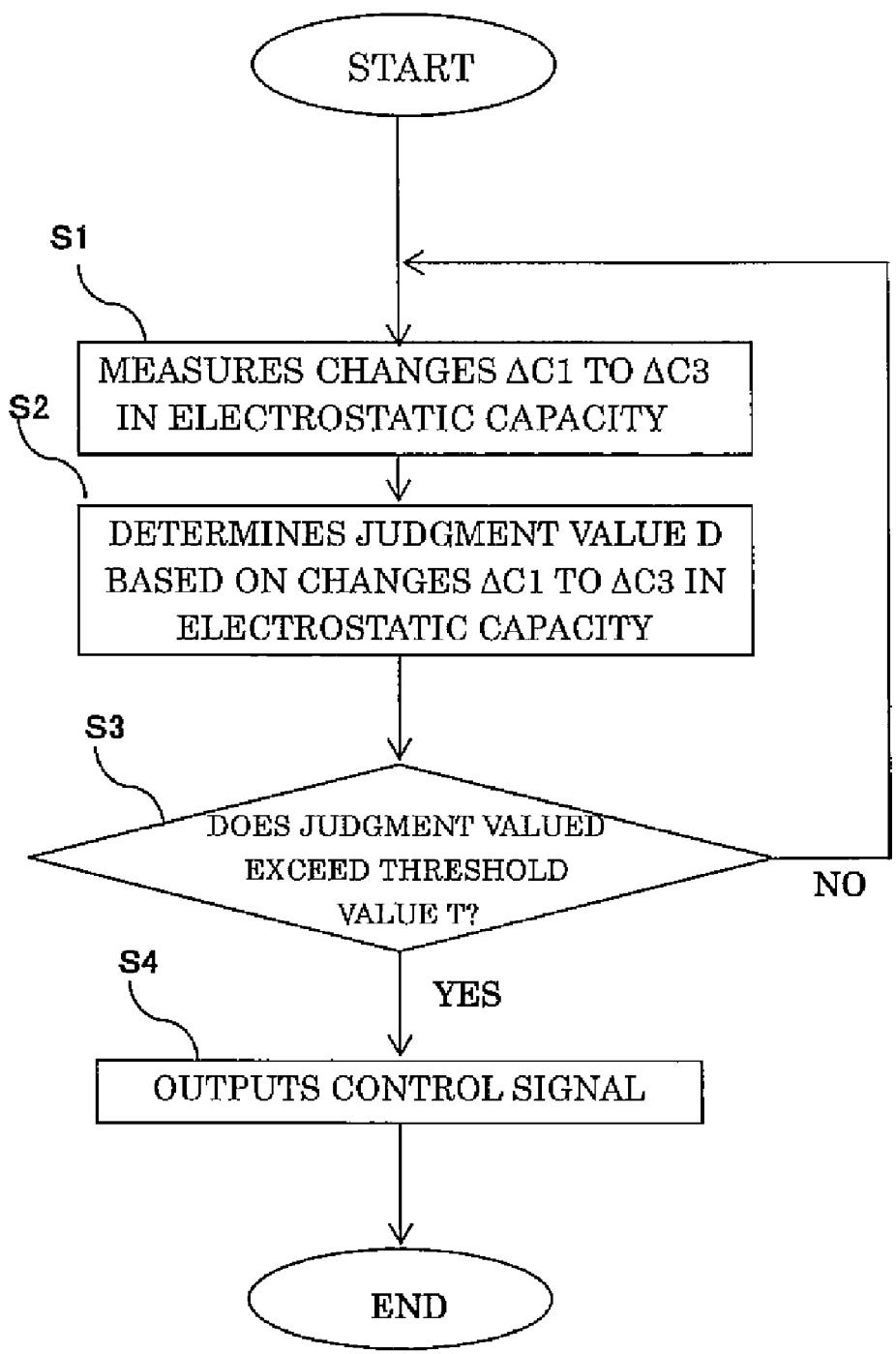
FIG. 3 is a flow chart showing processing performed by a capacity measurement/control unit.

The processing performed by the capacity measurement/control unit 34 will be described with reference to the flow chart of FIG. 3. The capacity measurement/control unit 34 measures individual changes $\Delta C1$ to $\Delta C3$ in electrostatic capacity between the conductor plates 20-1 to 20-3 and the ground conductor 26 (S1). The changes in electrostatic capacity can be measured by, for example, measuring electrostatic capacities at intervals of a prescribed time $\Delta t$ and determining a difference obtained by subtracting, from the measured value of an electrostatic capacity obtained at a prescribed time, the measured value of an electrostatic capacity which is obtained earlier, by the time $\Delta t$, than when the measured value is obtained. The electrostatic capacity is preferably measured by impedance measurement, measurement based on a charging time constant, or the like.

The capacity measurement/control unit 34 determines as a judgment value D the absolute value of a value obtained by subtracting a minimum absolute value among the changes $\Delta C1$ to $\Delta C3$ in electrostatic capacity from a maximum absolute value among the changes $\Delta C1$ to $\Delta C3$ in electrostatic capacity (S2).

The capacity measurement/control unit 34 judges whether the judgment value D exceeds a prescribed threshold value T (S3). If the judgment value D is equal to or less than the threshold value T, the processing returns to step S1. Meanwhile, if the judgment value D exceeds the threshold value T, a control signal instructing switching of the switch 28 is output (S4). As the control signal, it is suitable to apply a pulse signal. When the control signal is input and if the switch 28 is in an OFF state, the switch 28 is changed over to an ON state to turn on the lamp 14, while if the switch 28 is in an ON state, it is changed over to an OFF state to turn off the lamp 14.

In the vehicle accessory touch switch 32, when the individual conductor plates 20-1 to 20-3 are configured to have an area larger than the effective touch area of a person's hand touching on the sensor surface 16T, the entire area of regions on the sensor surface 16T corresponding to regions covered by the conductor plates 20-1 to 20-3 on the opposite side of the sensor plate 16 cannot be touched with the person's hand. Thus, where the sensor surface 16T is touched with the person's hand, a change in electrostatic capacity of the conductor plate located closest to the position touched with the human hand can be made largest.

In a case where two regions on the sensor surface 16T corresponding to two mutually adjacent conductor plates, among the conductor plates 20-1 to 20-3, are touched with the person's hand by equal amounts, the two conductor plates have substantially the same change in electrostatic capacity. Even in such a case, since the touch plate 16 is provided with the three conductor plates 20-1 to 20-3, changes in electrostatic capacity of the two conductor plates and a change in electrostatic capacity of the remaining one conductor plate can be differentiated.

According to the principle described above, the vehicle accessory touch switch 32 according to this embodiment is configured such that the judgment value D becomes larger than the threshold value T when the sensor surface 16T is touched with the person's hand. Thus, the switch 28 can be controlled by touching the sensor surface 16T with the person's hand to turn the lamp 14 on or off.

Also, the individual conductor plates 20-1 to 20-3 are formed to have an area appropriate to configure the vehicle accessory touch switch 32 mounted on a vehicle. Therefore, if air around the vehicle accessory touch switch 32 experiences a change in humidity or the like, a difference among capacity changes $\Delta C1$ to $\Delta C3$ is small, and the judgment value D becomes less than the threshold value T. Besides, even if a noise voltage is induced in the conductor plates 20-1 to 20-3 upon the arrival of unnecessary electromagnetic waves, the capacity changes $\Delta C1$ to $\Delta C3$ have an error of substantially the same value, so that the judgment value D becomes less than the threshold value T. Thus, a malfunction due to a change in the environment where the vehicle accessory touch switch 32 is disposed can be avoided.

A vehicle accessory touch switch 32 using three conductor plates 20-1 to 20-3 has been described above. In addition to the above-described configuration, a configuration using n-number (n is an arbitrary natural number excluding 1 and 3) of conductor plates can also be provided. In such a case, the capacity measurement/control unit 34 measures the changes $\Delta C1$ to $\Delta Cn$ in electrostatic capacity of the individual n-number of conductor plates with respect to the ground conductor 26 and determines as the judgment value D the absolute value of a value obtained by subtracting a minimum absolute value, among the changes $\Delta C1$ to $\Delta Cn$ in electrostatic capacity, from a maximum absolute value among the changes $\Delta C1$ to $\Delta Cn$ in electrostatic capacity.

As the judgment value D, a value indicating a level of prominence of the maximum absolute value among the changes $\Delta C1$ to $\Delta Cn$ in electrostatic capacity from the absolute value of the other values, a value indicating variations of the changes $\Delta C1$ to $\Delta Cn$ in electrostatic capacity, or the like may be determined statistically and applied. For example, as such a value, a value obtained by subtracting the average value of the absolute values of the changes $\Delta C1$ to $\Delta Cn$ in electrostatic capacity from the maximum absolute value among the changes $\Delta C1$ to $\Delta Cn$ in electrostatic capacity, or the standard deviation of the changes $\Delta C1$ to $\Delta Cn$ in electrostatic capacity, can be applied.

When it is assumed that three or more conductor plates are disposed on the touch plate 16, the following problems involved when two regions on the sensor surface 16T corresponding to two mutually adjacent conductor plates are touched with the person's hand by equal amounts, the two conductor plates have substantially the same change in electrostatic capacity. In such a case, the judgment value D cannot be made larger than the threshold value T, so that the switch 28 cannot be controlled. Accordingly, disposition of three or more conductor plates on the touch plate 16 can provide a difference between the changes in electrostatic capacity of the two mutually adjacent conductor plates and a change in electrostatic capacity of the remaining conductor plate, the judgment value D can be made larger than the threshold value T, and the switch 28 can be controlled.

Figure 4:
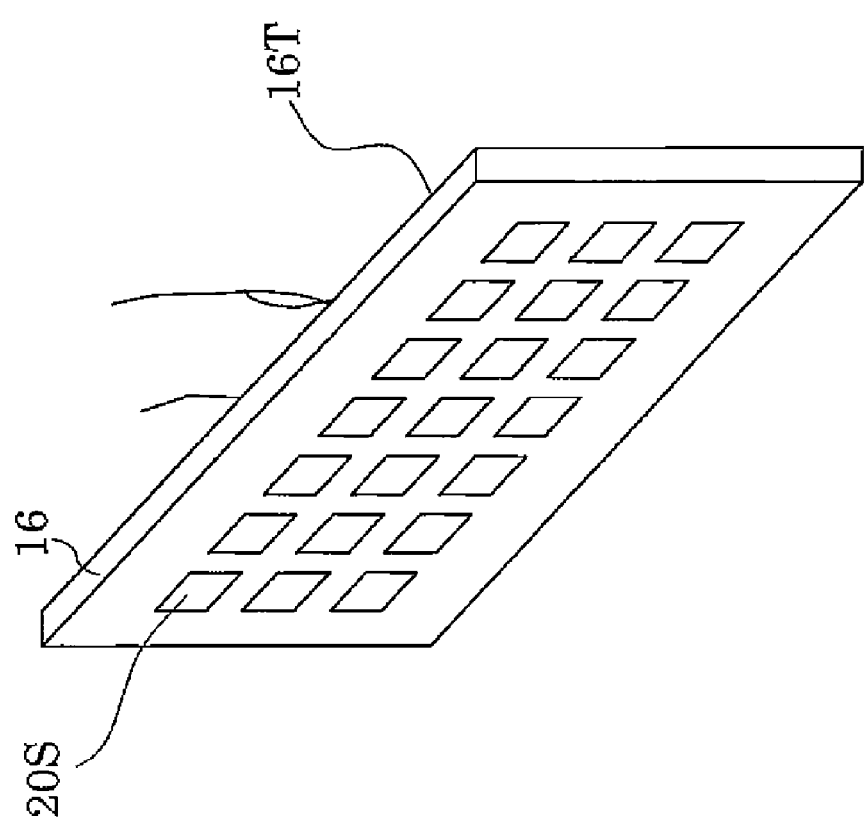
FIG. 4 is a diagram showing a touch plate provided with plural conductor plates each having an area smaller than that of a finger.

It was determined above that the area of each conductor plate was larger than the effective touch area where the sensor surface 16T was touched by the person's hand. As a modified example of this embodiment, it can be configured with the area of each conductor plate being smaller than the effective touch area of the person's hand. In such a case, it is desirable for the number of conductor plates disposed on the touch plate 16 to be increased by arranging plural conductor plates on the touch plate 16 to cover a region larger than the effective touch area. For example, it can be configured having plural conductor plates 20S each having an area smaller than the area of a finger arranged on the touch plate 16 at prescribed intervals as shown in FIG. 4. FIG. 4 shows an example where 21 conductor plates 20S are disposed. The individual conductor plates 20S are connected to the capacity measurement/control unit 34.

According to the above configuration, the person's hand might uniformly touch the plural regions on the sensor surface 16T to which some conductor plates among all the conductor plates are projected. In such a case, a change in electrostatic capacity occurs uniformly in the above limited plural conductor plates but it can be determined that such a change can be differentiated from a change in electrostatic capacity of the remaining conductor plate. Therefore, the judgment value D can be determined to be larger than the threshold value T, and the switch 28 can be controlled.

Figure 5:
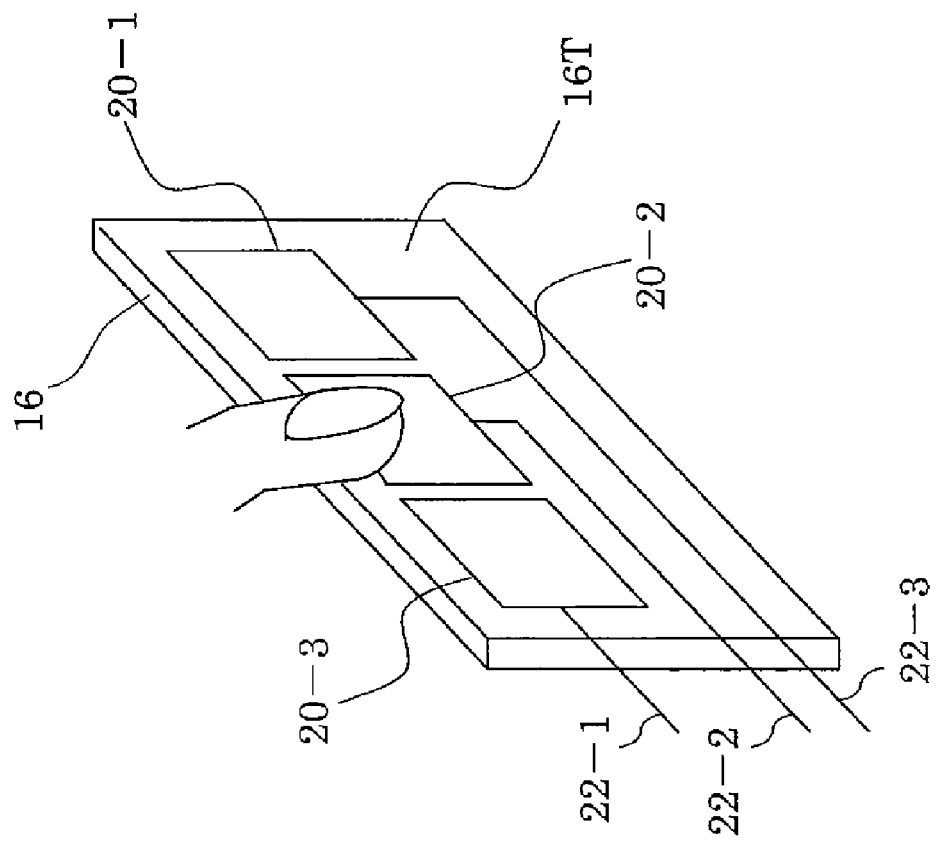
FIG. 5 is a diagram showing a touch plate having conductor plates disposed on a sensor surface.

The configuration where the conductor plates were disposed on the surface opposite to the sensor surface 16T was described above. In addition to the above configuration, it may be configured with the conductor plates disposed on the sensor surface 16T as shown in FIG. 5. In such a case, the capacity measurement/control unit 34 measures the changes in electrostatic capacity of the conductor plates due to contact or proximity of a human hand to the conductor plates, and controls the switch 28 according to the measured result.

Figure 6:
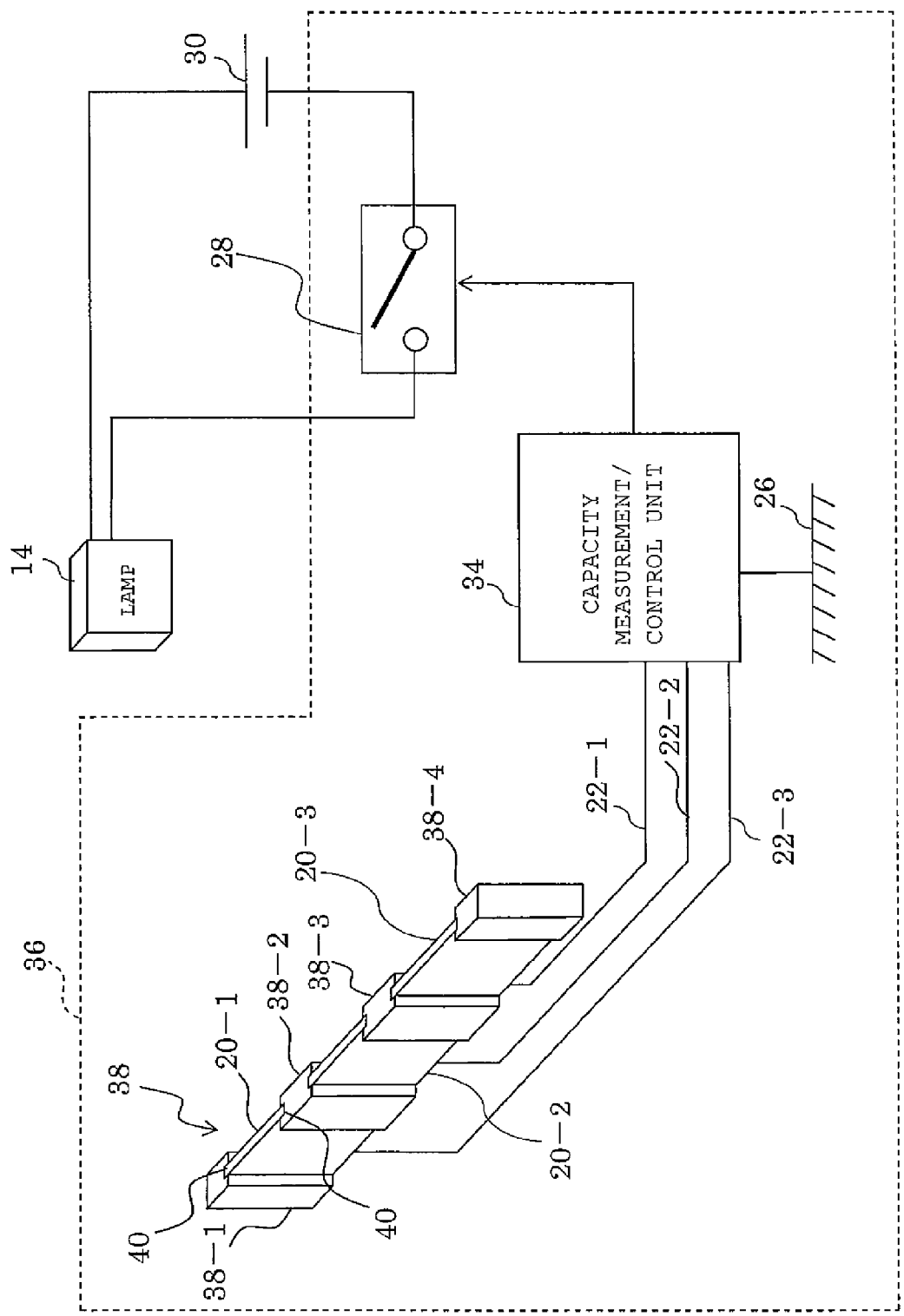
FIG. 6 is a diagram showing a structure of a vehicle accessory touch switch according to a second embodiment.

A vehicle accessory touch switch 36 according to a second embodiment of the invention will now be described with reference to FIG. 6. Similar component parts corresponding to those of the vehicle accessory touch switch 32 of FIG. 2 are denoted by similar reference numerals, and their descriptions will be omitted. The vehicle accessory touch switch 36 has the touch plate 16 of the vehicle accessory touch switch 32 replaced with a touch unit 38.

The touch unit 38 is provided with conductor plates 20-1 to 20-3, and supporting dielectric bodies 38-1 to 38-4.

The supporting dielectric bodies 38-1 to 38-4 are formed having a pillar shape. Their sectional shape perpendicular to their stretched direction is arbitrary. Here, the supporting dielectric bodies 38-1 to 38-4 are formed to have the shape of a substantially square pillar. The supporting dielectric bodies 38-1 to 38-4 have a length in the stretched direction substantially equal to the length in the vertical direction of the conductor plates 20-1 to 20-3.

The supporting dielectric bodies 38-1 and 38-2 are fixed to the internal surface of the main wall 10C of the door pocket at an interval of substantially the same distance as the length in the horizontal direction of the conductor plate 20-1. The supporting dielectric body 38-3 is fixed to the internal surface of the main wall 10C of the door pocket at an interval of substantially the same distance as the length in the horizontal direction of the conductor plate 20-2 from the supporting dielectric body 38-2. The supporting dielectric body 38-4 is fixed to the internal surface of the main wall 10C of the door pocket at an interval of substantially the same distance as the length in the horizontal direction of the conductor plate 20-3 from the supporting dielectric body 38-3.

A groove 40 is formed in the surfaces of the supporting dielectric bodies 38-1 to 38-4, which are formed to face the adjacent supporting dielectric body, along the stretched direction of the supporting dielectric bodies.

The conductor plate 20-1 is inserted between the groove 40, which is formed in the surface of the supporting dielectric body 38-1 facing the supporting dielectric body 38-2, and the groove 40 which is formed in the surface of the supporting dielectric body 38-2 facing the supporting dielectric body 38-1. The conductor plate 20-2 is inserted between the groove 40, which is formed in the surface of the supporting dielectric body 38-2 facing the supporting dielectric body 38-3, and the groove 40 which is formed in the surface of the supporting dielectric body 38-3 facing the supporting dielectric body 38-2. The conductor plate 20-3 is inserted between the groove 40, which is formed in the surface of the supporting dielectric body 38-3 facing the supporting dielectric body 38-4, and the groove 40 which is formed in the surface of the supporting dielectric body 38-4 facing the supporting dielectric body 38-3.

By configuring as described above, the conductor plate 20-1 is fixed to the door pocket via the supporting dielectric bodies 38-1 and 38-2, the conductor plate 20-2 is fixed via the supporting dielectric bodies 38-2 and 38-3, and the conductor plate 20-3 is fixed via the supporting dielectric bodies 38-3 and 38-4. Thus, the touch unit 38 is fixed to the internal surface of the main wall 10C of the door pocket.

The touch unit 38 has the same function as that of the touch plate 16 of the vehicle accessory touch switch 32. Also, the capacity measurement/control unit 34 measures a change in electrostatic capacity of each of the conductor plates 20-1 to 20-3 and controls the switch 28 according to the measured result in the same manner as the capacity measurement/control unit 34 disposed on the vehicle accessory touch switch 32.

In the vehicle accessory touch switch 36, the conductor plates 20-1 to 20-3 are fixed by the supporting dielectric bodies 38-1 to 38-4, so that where a rigid metal or the like is used for the conductor plates 20-1 to 20-3, there is an advantage that the conductor plates can be fixed by a simple structure.

The vehicle accessory touch switch 36 can be configured using n-number of conductor plates in the same manner as the vehicle accessory touch switch 32. It can also be configured by decreasing the area of each conductor plate to a size smaller than the effective touch area of the person's hand, increasing the number of conductor plates and disposing plural conductor plates on a region larger than the effective touch area.

For the switch 28 provided in the vehicle accessory touch switches 32 and 36, a switch which is changed over from an OFF state to an ON state when a control signal is input, and then changed over to the OFF state after keeping the ON state for a prescribed time period may be applied. When such a switch is applied, the lamp 14 is lit for a prescribed time period after the touch plate 16 or the touch unit 38 is touched by a person's hand and goes off automatically. Thus, a person operating the lamp 14 can be free from a troublesome action of touching the touch plate 16 or the touch unit 38 again in order to turn off the lamp 14.

Figure 7:
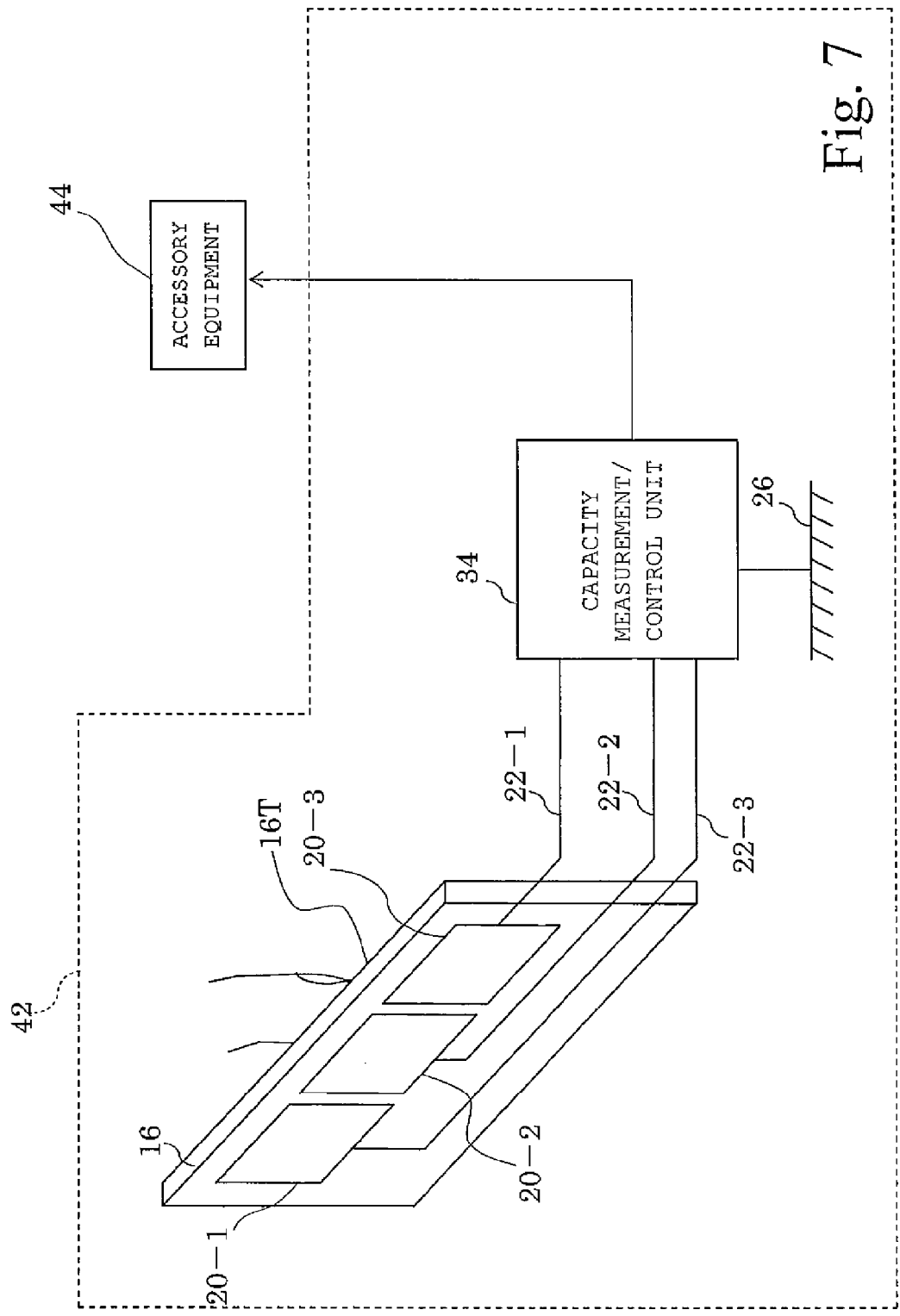
FIG. 7 is a diagram showing a structure of a vehicle accessory touch switch for controlling accessory equipment.

The vehicle accessory touch switches 32 and 36 can also be applied to the control of accessory equipment, such as automatic windows, a room lamp, a radio, an air conditioner, or the like, mounted on a vehicle, in addition to the control of the switch 28. A vehicle accessory touch switch 42 for controlling such accessory equipment is shown in FIG. 7. Similar component parts corresponding to those of FIG. 2 are denoted by similar reference numerals, and their descriptions will be omitted. The capacity measurement/control unit 34 in FIG. 7 controls accessory equipment 44. Generally, an accessory equipment control circuit is provided with a semiconductor device circuit which can perform control according to a pulse signal. Therefore, it can also control, for example, opening/closing of an automatic window, adjustment of a room lamp, tuning of a radio, temperature setting of an air conditioner, or the like.

What is claimed is:

1. A vehicle accessory touch switch, comprising:
   a touch section having conductor plates and the touch section being touchable by a person;
   a capacity measurement section which measures changes in electrostatic capacity between the individual conductor plates and a ground conductor;
   a control section which controls accessory equipment mounted on a vehicle according to the measured results of the capacity measurement section;
   wherein the touch switch controls the accessory equipment according to a person's touch on the touch section;
   wherein the touch section is provided with the plural conductor plates in an arrangement isolated from one another;
   wherein the control section controls the accessory equipment according to a difference among the individual changes in electrostatic capacity measured by the capacity measurement section; and
   wherein each of the conductor plates are configured to cover an area larger than the effective touch area of a person's hand touching the touch section.

2. The vehicle accessory touch switch according to claim 1, wherein the touch section is a touch plate formed of a dielectric body having the conductor plates disposed on one surface of the touch plate.

3. The vehicle accessory touch switch according to claim 2, wherein the conductor plates are disposed on a surface of the touch plate that a person can touch.

4. The vehicle accessory touch switch according to claim 2, wherein the conductor plates are disposed on a surface opposite to the surface of the touch plate that a person can touch.

5. The vehicle accessory touch switch according to claim 1, wherein the touch section is provided with dielectric bodies for supporting the edges of the conductor plates.

6. The vehicle accessory touch switch according to claim 1, wherein the control section controls the accessory equipment when the absolute value of a difference between the maximum value among the individual changes in electrostatic capacity measured by the capacity measurement section and the minimum value among the individual changes in electrostatic capacity measured by the capacity measurement section exceeds a prescribed threshold value.

7. The vehicle accessory touch switch according to claim 1, wherein the control section controls the accessory equipment according to variations in the electrostatic capacities measured on the plural conductor plates by the capacity measurement section.

8. The vehicle accessory touch switch according to claim 1, wherein the touch switch is applied to a door pocket of the vehicle and performs controls to turn a lamp disposed within the door pocket on or off.

9. A vehicle accessory touch switch, comprising:
   a touch section having three or more conductor plates and the touch section being touchable by a person;
   a capacity measurement section which measures changes in electrostatic capacity between the individual conductor plates and a ground conductor;
   a control section which controls accessory equipment mounted on a vehicle according to the measured results of the capacity measurement section;
   wherein the touch switch controls the accessory equipment according to a person's touch on the touch section;
   wherein the touch section is provided with the plural conductor plates in an arrangement isolated from one another;
   wherein the control section controls the accessory equipment according to a difference among the individual changes in electrostatic capacity measured by the capacity measurement section; and
   wherein the control section controls the accessory equipment when the absolute value of a difference between the maximum value among the individual changes in electrostatic capacity measured by the capacity measurement section and the minimum value among the individual changes in electrostatic capacity measured by the capacity measurement section exceeds a prescribed threshold value.

* * * * *